United States Patent [19]

Tei

[11] Patent Number: 4,660,277
[45] Date of Patent: Apr. 28, 1987

[54] METHOD FOR FORMING LARGE AREA AMORPHOUS SEMICONDUCTOR LAYER AND CONTACT TYPE IMAGE SENSOR

[75] Inventor: Sadahiro Tei, Ebina, Japan

[73] Assignee: Fuji Xerox Co. Ltd., Japan

[21] Appl. No.: 745,879

[22] Filed: Jun. 18, 1985

[30] Foreign Application Priority Data

Jun. 22, 1984 [JP] Japan .................. 59-128924

[51] Int. Cl.$^4$ ............................................. H01L 31/18
[52] U.S. Cl. ........................................ 29/572; 29/574;
  29/583; 29/589
[58] Field of Search .................. 29/572, 574, 583, 589;
  427/39, 74, 86

[56] References Cited

U.S. PATENT DOCUMENTS

| | | | |
|---|---|---|---|
| 4,377,723 | 3/1983 | Dalal | 136/249 |
| 4,430,185 | 2/1984 | Shimomoto et al. | 204/192 P |
| 4,479,455 | 10/1984 | Doehler et al. | 118/718 |
| 4,517,733 | 5/1985 | Hamano | 29/572 |

FOREIGN PATENT DOCUMENTS

| | | | |
|---|---|---|---|
| 56-135979 | 10/1981 | Japan | 29/572 |
| 59-229862 | 12/1984 | Japan | 29/572 |

*Primary Examiner*—Aaron Weisstuch
*Attorney, Agent, or Firm*—Handal & Morofsky

[57] ABSTRACT

A flexible insulating substrate is fed through an amorphous semiconductor layer forming region, and an amorphous semiconductor layer is formed on the substrate continuously and in a wide range along its length. In this manner, an array of photoelectric converting elements is formed continuously along the length of the flexible substrate, the substrate thus formed with the array is cut into a plurality of chips, and each chip having the elements is bonded onto a member supporting driving circuits thereby producing a contact type image sensor capable of sensing a wide range of image simultaneously.

14 Claims, 13 Drawing Figures

METHOD FOR FORMING LARGE AREA AMORPHOUS SEMICONDUCTOR LAYER AND CONTACT TYPE IMAGE SENSOR

BACKGROUND OF THE INVENTION

1. Field of the Invention

This invention relates to methods for forming a large area amorphous semiconductor layer and for producing a contact type image sensor, and also to a contact type image sensor thus produced.

2. Description of Prior Art

In a data input device of a facsimile apparatus or copying machine and the like, a contact type image sensor with a large sized readout element having a width substantially equal to that of an original copy and hence requiring no optical system for reducing images has been used for the purpose of reducing the size of the apparatus and simplifying related mechanisms.

As shown in FIG. 1, the contact type image sensor typically comprises a photoelectric converting element portion L and a driving circuit portion D for driving the photoelectric converting element portion L. The photoelectric converting element portion L comprises a lower electrode 2 made of a thin film of a metal such as chromium, which is dividedly formed on a glass substrate 1, a photoconductive layer 3 made of a thin layer of hydrogenated amorphous silicon, and an upper transparent electrode 4 made of indium-tin oxide (ITO) or the like, these electrodes and layer being laminated in the aforementioned order in a sandwich manner. Since no optical reduction system is necessary with the contact type image sensor, the width of the photoelectric converting element portion L must be equal to or larger than the width of the original copy. Thus, readout elements having widths of 210 mm and 256 mm are required to cover the original copies of No. 5 size of B series and No. 5 size of A series of the Japanese Industrial Standard (JIS), respectively. In the readout element, 1728 and 2048 sandwiched type photoelectric conversion elements constituting 1728 and 2048 bits are arranged in an array, respectively, and in order to read data correctly, these elements must be of precisely equal properties.

Ordinarily, the production of such an elongated readout element comprises the processes of forming a lower electrode in which a thin film of a metal such as chromium (Cr), nickel (Ni), platinum (Pt) and the like is formed by the vapor deposition method or the like on an inflexible insulating substrate 1 made of ceramic, glass, plastic or the like; forming the thin film into a desired pattern by the photolithoetching method; forming a photoconducting layer in which a photoconductive layer such as a hydrogenated amorphous silicon layer (s-Si:H) and the like is deposited by the glow discharge method; and forming a transparent electrode using a transparent material such as indium-tin oxide (ITO) by, for example, the sputtering method. To provide an element having uniform properties for each bit, the electrode films and the amorphous layer formed by the above described processes must be uniform throughout the entire surface of the substrate. Since an entire substrate becomes defective by the presence of only one defective bit, the formation of the films and the layer must be executed with great care to prevent the reduction of the yield.

In a contact type image sensor where uniform films and layer must be assured, the apparatus for fabricating the sensor becomes larger as the substrate becomes larger. Particularly in the process for depositing the amorphous semiconductor layer as a photoconductive layer by using plasma CVD apparatus, gas plasma flows unevenly at the end portions of parallel arranged planar electrodes for glow discharge in the plasma CVD apparatus. Thus, these end portions cannot be used to form a uniform layer. Therefore, still larger apparatus is required. To read documents of JIS B series No. 4 size for example, a readout element must be wider than 280 mm. However, apparatus now available cannot fabricate an image sensor whose readout portion is wider than 280 mm.

SUMMARY OF THE INVENTION

An object of the invention is to provide a method for producing a contact type image sensor of a long length and high reliability.

Another object of the invention is to provide a contact type image sensor produced according to the above mentioned method.

According to the present invention, a method for producing a contact type image sensor comprises steps of successively forming a lower electrode, an amorphous semiconductor layer and an upper electrode in this order on a flexible film utilized as a substrate while the film is moved continuously, thereby producing a photoelectric converting element array continuously, cutting the photoelectric conversion element array into pieces of a desired length, and mounting each piece of the array on a supporting member.

A contact type image sensor according to the invention comprises a photoelectric converting element array chip formed by arranging a plurality of photoelectric converting elements on a flexible substrate, and an inflexible supporting member supporting the photoelectric converting element array chip.

In the method according to the present invention, the amorphous semiconductor layer is continuously formed on a flexible insulating film passing through a layer forming region. Therefore, a large sized, especially long length uniform amorphous semiconductor layer can be produced. Furthermore, the area required for the formation of the layer can be reduced, and therefore the size of apparatus for producing image sensors can be substantially reduced. In addition, the continuous formation of the semiconductor layer improves the productivity. According to this method, a contact type image sensor having a width of more than 280 mm (for example, in a range of 500 mm to 1000 mm), which has been heretofore impossible, can be produced. With such image sensors, reading out of an original copy larger than JIS No. 4 size of B series is made possible without using an optical system for reduction, and therefore small original reading apparatus capable of reading a large size original copy can be realized.

DESCRIPTION OF THE PREFERRED EMBODIMENTS

Figure 1:
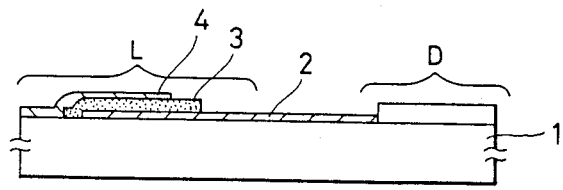
FIG. 1 is a sectional view of a conventional contact type image sensor.
Figure 2:
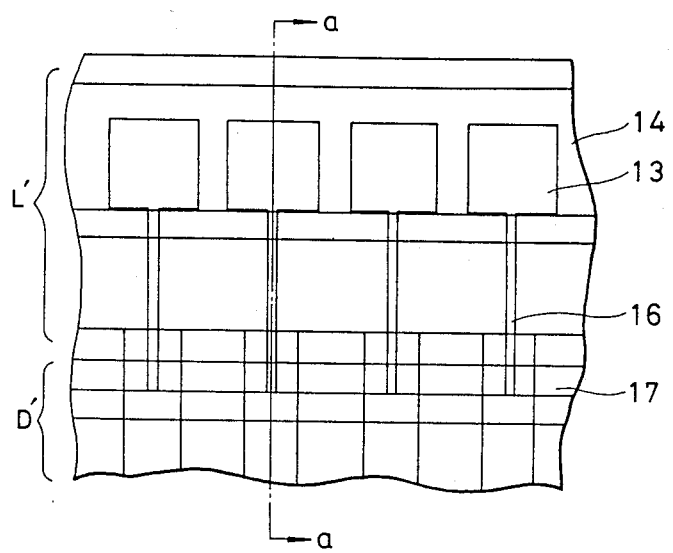
FIG. 2 is a fragmentary plan view showing a contact type image sensor according to the present invention.
Figure 3:
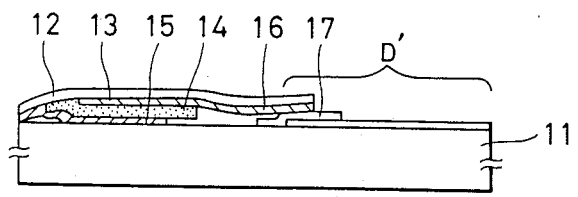
FIG. 3 is a sectional view along the line a—a in FIG. 1.

Referring now to FIGS. 2 and 3 showing a contact type image sensor according to the present invention, a flexible insulating film 12 made of, for instance, polyimide resin is provided with a plurality of divided lower electrodes 13 made of a chromium thin layer dividedly formed into a desired pattern, a photoconductive layer 14 made of a hydrogenated amorphous silicon, and a transparent upper electrode 15 made of indium-tin oxide (ITO), formed successively in this order. The insulating flexible film 12 thus prepared is bonded to a transparent glass substrate 11 so as to provide a sandwich type photoelectric converting portion L'. The portion L' is connected via a plurality of conductors 16 extending from the lower electrodes 13 with a driving circuit portion D' which is provided in the form of an integrated circuit on the glass substrate 11 with an anisotropic conductive film 17 interposed therebetween.

Figure 4:
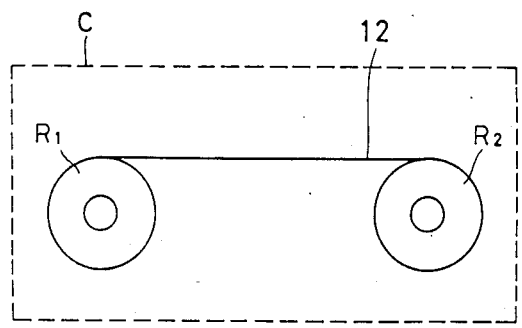
FIGS. 4 through 10 are diagrams showing the steps in the production of the image sensor shown in FIG. 2.
Figure 6:
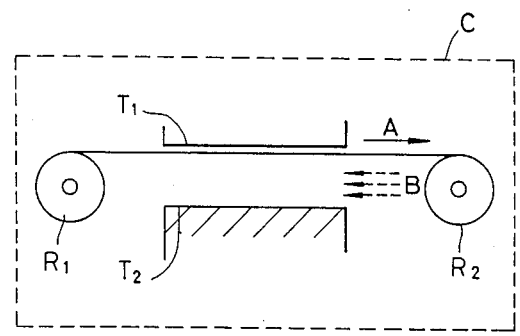
Figure 7:
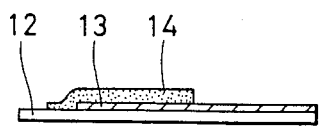

For producing the photoelectric converting element portion L' of the contact type image sensor shown in FIG. 2, a plasma CVD device for forming a photoconductive layer 14, a vapor depositing device for depositing the lower electrodes 13, a pattern-forming device for forming the lower electrodes 13 into a desired pattern, and a sputtering device for forming the upper electrode 15 are required. In each device, a film supplying roller R1 and a take-up roller R2 are provided either inside or outside of a chamber C as shown in FIGS. 4 and 6. When the insulating film 12 is fed through the chamber C, vapor depositing, pattern forming, and the other operations are carried out continuously.

Figure 5:

More specifically, a flexible insulating film 12 made of polyimide and having a thickness of from 10 to 100 μm is passed by the aid of the rollers R1 and R2 through a vacuum chamber of a vapor depositing device to perform a vapor depositing operation in the chamber so that a chromium layer of a thickness ranging from 1000 to 5000 Å is deposited on the polyimide film 12. The chromium layer is then divided into a desired pattern by a photolithoetching method, so that lower electrodes 13 as shown in FIG. 2 are formed (FIG. 5).

Referring to FIG. 6 the polyimide film 12, to which lower electrodes 13 is formed, is then fed by the aid of rollers R1 and R2 in a direction A between a pair of parallel arranged planar electrodes T1 and T2 of the plasma CVD device. A metal mask (not shown) is provided over a portion of the conductors 16. Between the two electrodes T1 and T2, glow discharge takes place while silane gas is supplied in a direction B reverse to the feeding direction A of the polyimide film 12. In this manner, a hydrogenated amorphous silicon layer of 0.1 to 2 μm in thickness can be formed continuously over the chromium layer forming the lower electrodes 13 except the masked portion.

The feeding speed of the rollers R1 and R2 at this time is set in a range of 1 cm/hour to 100 cm/hour, and the depositing conditions are selected such that the substrate temperature is in the range of 150° to 300° C., the flow rate of silane gas ($SiH_4$) is in the range of 10 to 100 SCCM, and the discharging electric power is in the range of 5 to 50 W.

Figure 8:
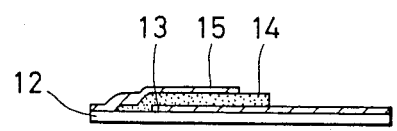

On the amorphous silicon hydride layer thus formed, a transparent upper electrode 15 made of indium-tin oxide layer of a thickness in the range of 500 to 3000 Å is formed by a sputtering method (FIG. 8). In this case also the formation of the indium-tin oxide layer is carried out continuously while the polyimide film 12 is fed between two rollers as in the case of the formation of the chromium thin layer.

Figure 9:
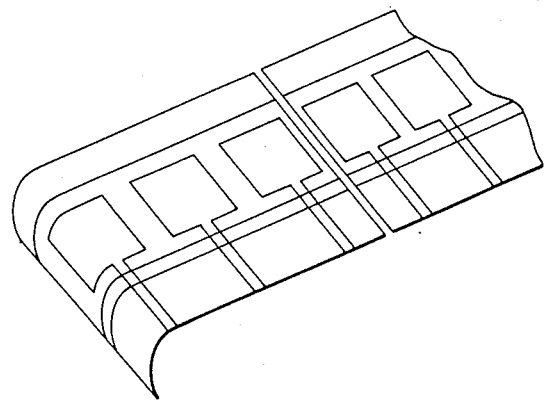

When the photoelectric converting element portion of a sandwich type is thus produced, the operation of each bit element formed on the polyimide film is checked by use of a testing device (not shown) for eliminating defective bit elements. Then, the polyimide film is cut into pieces of a desired length in such manner that the defective bits are removed before the determination of the length (FIG. 9).

Figure 10:
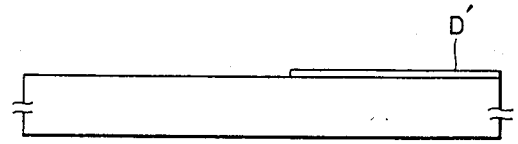

On an inflexible transparent glass substrate 11 operable as a supporting member, an integrated circuit pattern is formed by vapor deposition, a photolithoetching process or the like, thereby providing a driving circuit portion D' of the contact type sensor (FIG. 10). Then a piece of the polyimide film cut into the desired length is placed on the glass substrate, while the photoelectric converting element portion formed on the polyimide film is held on the lower side of the same, and the polyimide film is mounted via an anisotropic conductive layer 17 to the glass substrate formed with the driving circuit portion D' by way of, for instance, a thermal press-bonding method. The anisotropic conductive layer formed by the thermal press-bonding method is caused to have an electrically anisotropic property in that the layer is electrically conductive in the thickness direction while it is insulative in the lateral directions. In this embodiment, a polymer film, such as a polyimide film containing metal powder of fusable property (commercially available as, for example, CP2000 Series manufactured by SONY Products Corp.) is employed as the anisotropic conductive layer. In this manner, the conductive portions of the lower electrodes are connected through the anisotropic layer to the driving circuit portion D'. Thus, a contact type image sensor as shown in FIG. 2 is produced. The upper electrode and the driving circuit portion D' may be connected by means of an anisotropic conductive layer or a wire bonding method.

According to the present invention, since the formation of a uniform amorphous silicon layer on an extremely long region, which has been so far impossible, is now made possible in a continuous manner, defective bits in the contact type image sensor can be substantially reduced, and the reliability thereof can be improved. Furthermore, the production of a readout element having a length of more than 280 mm is now made possible, and the size of the production apparatus can be reduced while the productivity of producing such sensors can be improved. In addition, since defective bits are tested and removed prior to the application to the glass substrate, the yield of the production of the contact type sensor can be substantially improved.

Although in the above described embodiment the polyimide film has been bonded to the inflexible supporting member while the photoelectric converting element portion formed on the film is held on the lower side of the film, the film may be bonded to the supporting member with the photoelectric converting element portion held on the upper side of the film, and the lower electrodes in the element portion may be electrically connected with the driving circuit portion D' by the wire bonding method.

Figure 11:
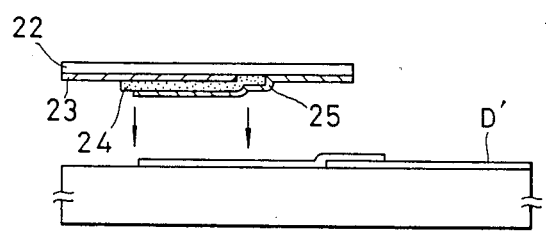
FIGS. 11 and 12 are sectional views of another embodiment of the contact type image sensor.
Figure 12:
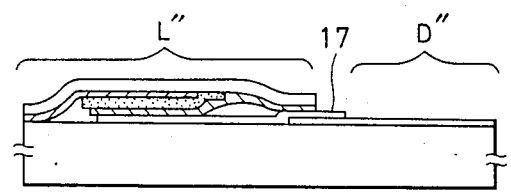

Furthermore, the materials for the transparent upper electrode 15 and the lower electrodes 13 shown in FIG. 3 may be interchanged, and a photoelectric converting element portion L" in FIG. 11 may be formed by laminating divided transparent electrodes 23 made of indium-tin oxide, a photoconductive layer 24 made of hydrogenated amorphous silicon, and a metal electrode 25 made of chromium thin layer in this order on a flexible insulating film 22 made of a transparent polyimide resin. The photoelectric converting element portion L" is then heat- and press-bonded, in a similar manner as in the above described embodiment, onto a ceramic substrate 11 formed with the driving circuit portion D" so that the metal electrode 25 is brought into contact with the anisotropic conductive layer 17 as shown in FIG. 12.

The materials and the way of forming layers in the photoelectric converting element portion are not necessarily restricted to those in the above described embodiments. That is, the polyimide resin used for providing the insulating film may be replaced by any other suitable materials which are flexible and insulating.

The metal electrode constituting the lower electrodes may be made of nickel (Ni), platinum (Pt), aluminum (Al), palladium (Pd), titanium (Ti), molybdenum (Mo), tantalum (Ta) and the like instead of chromium (Cr).

The transparent upper electrode may be made of tin oxide and the like instead of indium-tin oxide, and the photoconductive layer may be made of an amorphous semiconductor layer such as a hydrogenated amorphous silicon germanium layer and the like instead of the amorphous silicon hydride layer.

The substrate used as a supporting member may also be made of stainless steel and the like instead of glass or ceramic.

The arrangement of elements in the photoelectric converting element portion may be comb shaped so that the lead wires thereof are taken out in reverse directions alternately, and the mounting method of the photoelectric converting element portion on the supporting member may also be selected suitably.

Figure 13:
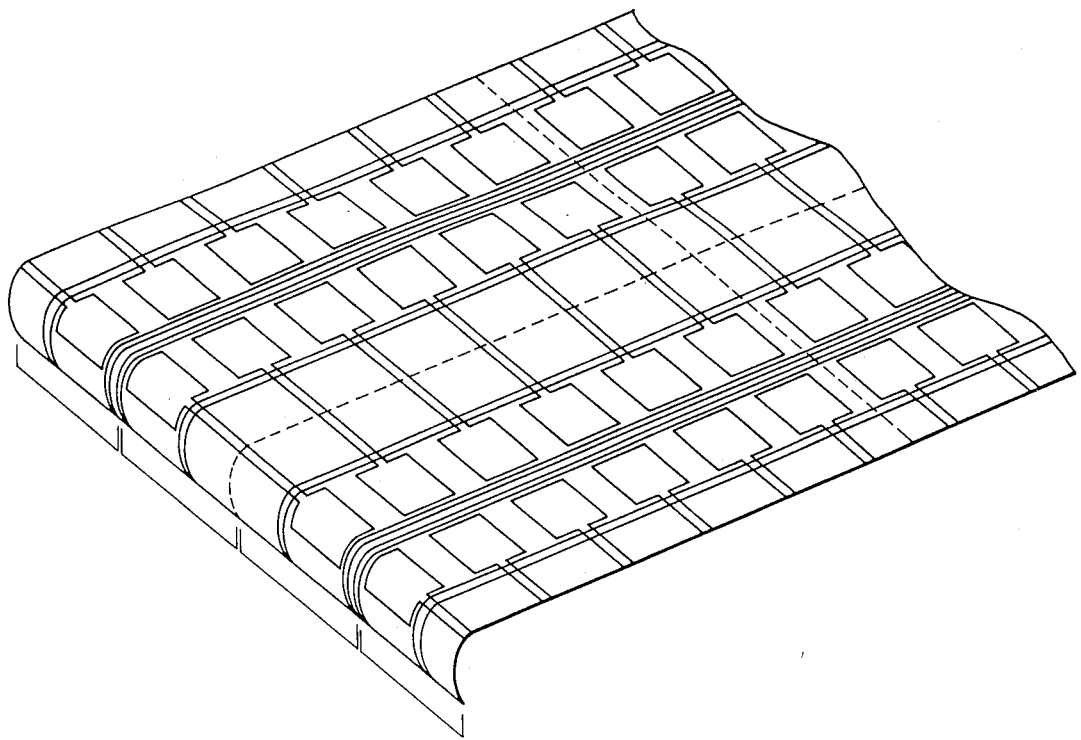
FIG. 13 is a perspective view showing one step of another embodiment for producing the image sensor producing steps.

Further, in the above described embodiment, the photoelectric converting element portion L' has been firstly formed on the polyimide film in a continuous row, and then cut into pieces. However the portion L' may firstly be provided in a plurality of continuous rows, and then cut into pieces along dotted lines as shown in FIG. 13. In this manner, the productivity of the sensor can be improved remarkably.

What is claimed is:

1. A method for producing a contact type image sensor comprising: an array forming step of forming a photoelectric converting element array on a flexible substrate, said array forming step comprising the steps of forming continuously a plurality of lower electrodes on said flexible substrate by passing said substrate through a first depositing region, forming continuously an amorphous semiconductor layer on said substrate formed with said lower electrodes by passing said substrate through a second depositing region, and forming continuously an upper electrode on said substrate formed with said lower electrodes and said amorphous semiconductor layer by passing said substrate through a third depositing region;

a cutting step of cutting said photoelectric converting element array thus formed into a plurality of photoelectric converting element array chips each having a desired size; and a bonding step of bonding at least one said photoelectric conversion element array chip to a supporting member.

2. The method as set forth in claim 1 wherein said cutting step includes a testing step for testing the operation of said photoelectric converting elements contained in said photoelectric converting element array, and said array is cut into said chips such that the photoelectric converting elements found to be defective in said testing step are removed during the cutting step.

3. The method as set forth in claim 1 wherein said bonding step is carried out with said photoelectric converting elements formed on said chip being held on the lower side of the chip.

4. The method as set forth in claim 3 wherein said supporting member is provided with a plurality of driving circuits, and said bonding step is carried out such that the photoelectric converting elements formed on said chip are electrically connected with said driving circuits through an anisotropic conductive layer.

5. The method as set forth in claim 4 wherein said flexible substrate is a polyimide film.

6. The method as set forth in claim 1 wherein said amorphous semiconductor layer is made of amorphous silicon hydride.

7. The method as set forth in claim 6 wherein said upper electrode is made of indium-tin oxide.

8. The method as set forth in claim 7 wherein said lower electrode layer is made of chromium.

9. The method as set forth in claim 1 wherein said amorphous semiconductor layer is made of hydrogenated silicon germanium.

10. The method as set forth in claim 1 wherein said upper electrode is made of tin oxide.

11. The method as set forth in claim 1 wherein said lower electrode layer is made of a material selected from nickel (Ni), platinum (Pt), aluminum (Al), palladium (Pd), titanium (Ti), molybdenum (Mo), and tantalum (Ta).

12. The method as set forth in claim 1 wherein said supporting member is made of glass, ceramic, or stainless steel.

13. The method as set forth in claim 1 wherein said array forming steps are executed such that a plurality of photoelectric converting element arrays are formed on said flexible substrate in rows.

14. The method as set forth in claim 1 wherein said supporting member is an inflexible substrate.

* * * * *